May 17, 1966 A. SCHMITZ 3,251,757
METHOD OF IMPROVING THE ELECTRICAL PROPERTIES OF A GALLIUM ARSENIDE SEMICONDUCTOR DEVICE
Filed April 25, 1961
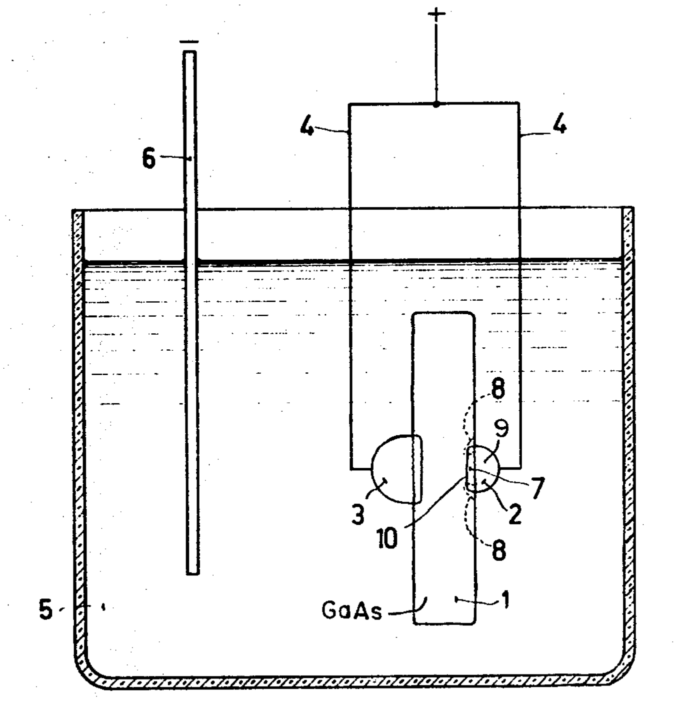
INVENTOR
ALBERT SCHMITZ
BY
[signature]
AGENT United States Patent Office 3,251,757

Patented May 17, 1966

3,251,757

METHOD OF IMPROVING THE ELECTRICAL PROPERTIES OF A GALLIUM ARSENIDE SEMICONDUCTOR DEVICE

Albert Schmitz, Eindhoven, Netherlands, assignor to North American Philips Company, Inc., New York, N.Y., a corporation of Delaware Filed Apr. 25, 1961, Ser. No. 105,475
Claims priority, application Netherlands, June 7, 1960, 252,283
4 Claims. (Cl. 204—143)

The invention relates to a method of manufacturing a semi-conductive electrode system comprising a semi-conductor body of gallium arsenide provided with one or more electrodes and one or more asymmetrically conductive junctions, in which the semi-conductor body after the provision of at least one such junction and at least one electrode is subjected to an etching treatment. The invention further relates to such semi-conductive electrode systems made by such a method.

In manufacturing semi-conductive electrode systems provided with an asymmetrically conductive junction on the basis of gallium arsenide, in order to obtain satisfactory electrical properties it is of essential importance that not only a suitable technique for the provision of the electrodes and the junction but also a suitable final etching treatment of the system should be available, in which final etching treatment any damaged or contaminated portions of the semi-conductor surface in the region adjacent the asymmetrically conductive junctions are removed.

For this purpose, with gallium arsenide usually a chemical etching method is employed which uses an acid etching bath, which may consist of an aqueous solution containing HF and $HNO_3$. In the Bell System Technical Journal 38, No. 1 (January 1959), pages 259 to 269, such a final etching treatment has been described which was used in manufacturing a GaAs switching diode provided with a point contact as the asymmetrically conductive junction and as the electrode. In the Journal of the Electrochemical Society, vol. 107, No. 1 (January 1960), pages 26 to 29, the manufacture of a p-n-switching diode from gallium arsenide by means of solid diffusion has been described, an aqueous solution of equal parts of $HNO_3$, HF and $CH_3COOH$ being used as the chemical etching bath. In the Journal of Applied Physics (February 1960), 31, pages 611 to 612, the use of an acid chemical etching bath has also been described. It has further been proposed in Soviet Physics, Technical Physics, vol. 3, No. 4, pages 726 to 728 (April 1958), to use a boiling chemical etching bath comprising 50 ml. of 5% NaOH and 10 ml. of 30% $H_2O_2$.

The known chemical etching processes, however, have a limitation in that they do not permit an accurate control of the etching process, since with a given composition of the etching bath the etching speed substantially cannot be controlled to the desired extent, while furthermore after the removal of the semi-conductive electrode system from the etching bath, the etching action continues until all the residual liquid is removed from the system, and this is inconvenient especially in cases where the etching treatment is performed after the semi-conductive system has been mounted in a not readily accessible envelope. In addition, the conventional acid etching bath has a serious disadvantage in that it attacks the electrode materials commonly used, such as lead and tin.

It is an object of the invention to provide a particularly suitable etching treatment for use in the manufacture of semi-conductive electrode systems comprising an asymmetrically conductive junction and a body of gallium arsenide, which process enables the above-mentioned limitations to be substantially eliminated and furthermore favourably affects the electrical properties of the semi-conductive electrode systems treated.

For this purpose, in the method according to the invention as mentioned in the preamble, etching is performed electrolytically in an alkaline etching bath, a voltage which is positive with respect to the etching bath being applied to the semi-conductor body by means of one or more electrodes.

Preferably the etching bath consists at least substantially of an aqueous solution of a hydroxide of either or both of the alkaline metals sodium and potassium. These preferred etching baths give the best results, although other alkaline solutions, for example, a 30% aqueous solution of $NH_4OH$, give satisfactory results. The etching process according to the invention has the particular advantage that the etching action can be accurately controlled as desired by control of the current, the etching liquid attacking the body especially in the region of surface portions of an asymmetrically conductive junction, while on removal of the voltage applied no or at least substantially no etching takes place. Accordingly, the expression "consists at least substantially of" is to be understood to mean that although preferably the etching liquid in general consists solely of the said solution, further active substances may be added, which in a certain case may bring about a further desired effect, but which preferably should not so affect the etching bath as to give rise to considerable etching under the conditions of the etching process without a voltage being applied.

The concentration of the etching bath may be varied within wide limits. Very good results may be obtained with a 40% solution of KOH or NaOH, however, solutions of considerably lower concentrations, for example a 5% solution, may be used.

The invention is of particular importance in the manufacture of such semi-conductive electrode systems comprising a semi-conductor body consisting essentially of gallium arsenide and dopant impurities therefor, in which at least one asymmetrically conducting junction, generally a p-n-junction, and at least one electrode connected thereto are obtained by the known alloying technique. The junction and an electrode are obtained by alloying to the semi-conductor body an electrode material containing appropriately active impurities, in which process a slight amount of the subjacent gallium arsenide is dissolved in the molten electrode material, which amount containing a certain proportion of the added active impurities is again deposited at the point concerned during cooling, the remainder of the melt subsequently solidifying on this recrystallized part as a metal contact member. A suitable final etching treatment of such rectifying alloyed electrodes is particularly desirable since owing to the close proximity of the junction and the electrodes and owing to the nature of the process the likelihood of contamination of the surface and of damage is great. With such a rectifying alloyed electrode the use of the known conventional acid chemical etching treatment gives unsatisfactory results. Since the electrode materials commonly used in this technique, for example lead and tin, dissolve in an acid etching bath, a masking layer for protecting the electrode is required during etching. However, this masking layer is not sufficient, since during the etching process the etching liquid penetrates under the metal part, which may thus be attacked. It is substantially impossible to shorten the duration of the treatment, because in this case the etching action would be insufficient to provide the desired rectifying properties of the junction. However, the said disadvantages may be avoided by applying the etching process in accordance with the invention to a junction produced by alloying, because in this process the electrode is not attacked, while very satisfactory electrical properties of the junction may be obtained.

For these reasons, the method according to the invention is also particularly suited for use in the cases where it is desirable for the surface area of a symmetrically conducting junction to be limited by etching under the electrode. This method is of particular importance for semi-conductive electrode systems to be used as switches, in which frequently a very slight active area of the asymmetrically conductive junction is desirable in order to limit the capacitance, for example in switching transistors or switching diodes. In addition, the simple and accurate controllability of the etching process according to the invention is of great advantage in these cases.

The method according to the invention is also of particular importance for the manufacture of semi-conductive electrode systems exhibiting the tunnel effect and provided on a body of gallium arsenide, for example GaAs tunnel diodes. The term "semi-conductive electrode systems exhibiting tunnel effect" is used herein in known manner to signify devices comprising a semi-conductor body in which on both sides of an asymmetrically conductive junction (generally a p-n-junction) the resistivity of the semi-conductor is so slight that the Zener tunnel effect is even produced in the forward direction. The current-voltage characteristic of such a junction in the forward direction has the following known typical variation: starting from the origin of the characteristic, owing to the tunnel effect with increase of the voltage, the current in succession rapidly increases to a peak value and then decreases via a negative differential resistance portion of the characteristic to a minimum value, hereinafter referred to as trough value, while subsequently with further increase of the voltage in the forward direction the current continues to increase in the manner usual for the forward direction. In these tunnel-effect devices also, it is desirable for the asymmetrically conducting junction to be restricted to a small active surface. According to a further preferred embodiment of the invention, the etching treatment according to the invention may be used to great advantage for the manufacture of such semi-conductive electrode systems exhibiting tunnel effect, while in addition to the above-mentioned advantages the further advantage is obtained of a greater ratio between the peak value of the current and its trough value than with the use of the conventional acid chemical etching treatment.

In order that the invention may be readily carried into effect, it will now be described more fully with reference to the accompanying drawing and some embodiments.

The figure is a diagrammatic sectional view of a stage of the method according to the invention.

The manufacture of a high-speed switching alloyed diode may be effected as follows: one starts from a p-type GaAs wafer of the dimensions 2 x 2 x 0.25 cubic mm. and having a resistivity of about 1 ohm cm. To one side of the wafer an ohmic electrode is alloyed comprising an indium pellet having a diameter of, for example, 500 microns which is alloyed to the wafer in a hydrogen atmosphere at a temperature of about 550° C. with the use of $NH_4HF_2$ as flux for about half a minute. Then a pellet consisting of a gold tin arsenic alloy (Au 79% by weight, Sn 19% by weight, As 2% by weight) and having a diameter of about 150 microns is alloyed to the opposite side of the body at a temperature of about 500° C., other things being equal. After the alloying process, an ohmic characteristic is measured between the two electrodes.

Subsequently (cf. the figure) supply leads 4, which may consist of nickel, are secured to a rectifying electrode 2 and an ohmic electrode 3, and the semi-conductive system 1 is then arranged in an etching bath 5 consisting of a 40% solution of KOH. A platinum electrode 6 is also provided in the etching bath. The platinum electrode is connected to the negative terminal of a battery, to the positive terminal of which both supply leads 4 are connected. If desired, only one of the two supply leads may be connected to the positive terminal. The etching current is adjusted to about 100 ma. and the duration of the treatment is about 10 minutes. The figure shows the semi-conductor body in the initial stage of the treatment, in which the n-type recrystallized portions 7 of the rectifying electrode still is intact. At the end of the etching treatment, a shallow groove extending under the metal part 9 is removed by etching, as is shown by broken lines 8, so that the p-n-junction 10 is restricted to a small active portion. Measurements show that by the etching treatment a satisfactory rectifying characteristic is obtained between the electrodes 2 and 3. At a voltage of 1 v. in the forward direction, the current was about 1 ma., while at 15 v. in the reverse direction the current was only 10 nanoampere. The breakdown voltage was about 50 v. and the switching time was of the order of 1 nanosecond. It should be noted that the method according to the invention also permits a decrease of the etching rate by decreasing the etching current at the end of the process in order to enable the desired surface area of the p-n-junction 10 to be accurately determined.

A GaAs tunnel effect may be manufactured in the same manner as described hereinbefore, except that the GaAs initial body has a much lower resistance, for example a resistivity of 0.003 ohm cm., owing to stronger doping with zinc, and that the electrode material consists of an alloy providing a higher concentration of donors, for example a gold tin arsenic alloy containing 79% by weight of Sn, 19% by weight of Au and 2% by weight of As. Otherwise etching is performed similarly and continued until the desired surface area of the p-n-junction 10 is reached. Thus, by etching under the electrode 2 the p-n-junction may be reduced to 25 microns in a simple manner. It is of advantage for the etching current to be reduced, for example, to 0.1 ma., at the end of the treatment in order to provide accurate control in the final stage. Since in the case under consideration, namely the manufacture of a tunnel diode, the resistivity of the semi-conductor body is very low, the etching liquid not only attacks the region surrounding the p-n-junction, similarly to the case described hereinbefore, but thin layers of the remaining surface also are evenly removed by etching during the treatment.

Thus a GaAs tunnel diode was manufactured in which the peak value of the current occurred at about 110 mv. and was about 2 ma., while the trough value occurred at 500 mv. and was only 0.1 ma., so that the peak-trough ratio was 20. By way of comparison it should be noted that with the use of a conventional known chemical acid etching agent, for example, a solution of HCl and $HNO_3$, other things remaining the same, a peak-trough ratio of only 8 was reached, while the production of a small effective surface by etching under the electrode was substantially impossible when using this known etching agent.

Finally it should be pointed out that the invention is obviously not restricted to the applications described in the examples. Without departing from the scope of the invention, a person skilled in the art and versed in the technology of conventional electrolytic etching methods may make variations and refinements in carrying out the process. Furthermore, the method according to the invention may also be used to great advantage in the manufacture of other semi-conductive electrode systems comprising an asymmetrically conductive junction and a body of gallium arsenide, for example for the manufacture of transistors, tunnel diodes, photo diodes, photo transistors and the like. Although the invention is of particular importance for the manufacture of such semi-conductive electrode systems comprising at least one junction and electrode obtained by alloying, it may also be used to great advantage in other manufacturing methods, for example, in junctions made by solid diffusion.

What is claimed is:

1. A method of improving the electrical properties of a gallium arsenide semiconductor device comprising a semiconductive body consisting essentially of gallium arsenide and dopant impurities therefor and having at least one electrode of a material capable of resisting substantial attack by an alkaline etchant surface alloyed to the body forming a p-n junction, comprising immersing the body with alloyed electrode in an etching bath consisting essentially of an aqueous solution of a substance selected from the group consisting of sodium hydroxide, potassium hydroxide, and ammonium hydroxide in a concentration preventing substantial attack of the electrode, applying to the said alloyed electrode a potential that is positive relative to that applied to the bath in order to etch electrolytically and remove selected regions of the body in the vicinity of the p-n junction, and continuing to apply the potential until the junction characteristics have achieved a desired value.

2. A method as set forth in claim 1 wherein the etching is continued until a region of the body at the periphery of the electrode has been removed.

3. A method as set forth in claim 1 wherein the etching is continued until the junction edges and body regions underlying the electrode have been removed.

4. A method as set forth in claim 1 wherein the device is a tunnel diode.

References Cited by the Examiner

UNITED STATES PATENTS

| | | | |
|---|---|---|---|
| 2,798,989 | 7/1957 | Welker | 148—1.5 |
| 2,802,159 | 8/1957 | Stump | 204—143 |
| 2,827,427 | 3/1958 | Barry | 204—143 |
| 2,912,371 | 11/1959 | Early | 204—143 |
| 2,940,024 | 6/1960 | Kurshan | 204—143 |
| 3,046,176 | 7/1962 | Bosenberg. | |
| 3,088,888 | 5/1963 | Leff | 204—143 |
| 3,110,849 | 11/1963 | Soltys | 317—237 |
| 3,117,899 | 1/1964 | McLouski | 156—17 |

JOHN H. MACK, *Primary Examiner.*

JOHN R. SPECK, *Examiner.*

P. SULLIVAN, R. HARDER, *Assistant Examiners.*